(12) United States Patent
Mandegaran

(10) Patent No.: US 10,855,246 B2
(45) Date of Patent: Dec. 1, 2020

(54) ENHANCING ISOLATION IN HYBRID-BASED RADIO FREQUENCY DUPLEXERS AND MULTIPLEXERS

(71) Applicant: Qorvo US, Inc., Greensboro, NC (US)

(72) Inventor: Sam Mandegaran, Pasadena, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/711,692

(22) Filed: Sep. 21, 2017

(65) Prior Publication Data

US 2018/0083591 A1    Mar. 22, 2018

Related U.S. Application Data

(60) Provisional application No. 62/397,727, filed on Sep. 21, 2016.

(51) Int. Cl.

| | |
|---|---|
| H04B 1/04 | (2006.01) |
| H01P 5/12 | (2006.01) |
| H04W 24/00 | (2009.01) |
| H03H 7/46 | (2006.01) |
| H04L 5/14 | (2006.01) |
| H01P 5/18 | (2006.01) |
| H03H 9/70 | (2006.01) |
| H03H 9/72 | (2006.01) |

(52) U.S. Cl.
CPC ............. *H03H 7/465* (2013.01); *H01P 5/18* (2013.01); *H03H 9/706* (2013.01); *H03H 9/725* (2013.01); *H04L 5/14* (2013.01)

(58) Field of Classification Search
CPC ... H04B 1/0057; H04L 5/14; H04L 25/03019; G01S 7/034

USPC .......................................... 370/278; 455/424
See application file for complete search history.

(56) References Cited

U.S. PATENT DOCUMENTS

| | | |
|---|---|---|
| 2,561,212 A | 7/1951 | Lewis |
| 3,025,463 A | 3/1962 | Luoma et al. |
| 3,453,638 A | 7/1969 | Hoovler |
| 3,704,409 A | 11/1972 | Oomen |
| 3,800,218 A | 3/1974 | Shekel |

(Continued)

FOREIGN PATENT DOCUMENTS

| | | |
|---|---|---|
| CN | 2783638 Y | 5/2006 |
| CN | 101606332 A | 12/2009 |

(Continued)

OTHER PUBLICATIONS

EESR for European Appl. No. 13876497.2, dated Jul. 4, 2016.

(Continued)

*Primary Examiner* — Khaled M Kassim
*Assistant Examiner* — Jason A Harley
(74) *Attorney, Agent, or Firm* — Withrow & Terranova, P.L.L.C.

(57) ABSTRACT

A radio frequency (RF) duplexer may comprise quadrature hybrid couplers and RF filters. The isolation and insertion loss of such RF duplexer, often limited by practical imperfections such as component mismatches and layout asymmetries, may be improved by including capacitors in the RF duplexer. A tunable or reconfigurable RF duplexer with high isolation and low insertion loss, under all desired settings, may be realized by adding tunable capacitors to the tunable RF duplexer which includes the quadrature hybrid couplers and tunable RF filters.

20 Claims, 10 Drawing Sheets

(56) References Cited

U.S. PATENT DOCUMENTS

| | | |
|---|---|---|
| 4,029,902 A | 6/1977 | Bell et al. |
| 4,146,851 A | 3/1979 | Dempsey et al. |
| 4,427,936 A | 1/1984 | Riblet et al. |
| 4,464,675 A | 8/1984 | Balaban et al. |
| 4,489,271 A | 12/1984 | Riblet |
| 4,694,266 A | 9/1987 | Wright |
| 4,721,901 A | 1/1988 | Ashley |
| 4,963,945 A | 10/1990 | Cooper et al. |
| 4,964,945 A | 10/1990 | Cooper et al. |
| 4,968,967 A | 11/1990 | Stove |
| 5,408,690 A | 4/1995 | Ishikawa et al. |
| 5,483,248 A | 1/1996 | Milroy |
| 5,493,246 A | 2/1996 | Anderson |
| 5,525,945 A | 6/1996 | Chiappetta et al. |
| 5,574,400 A | 11/1996 | Fukuchi |
| 5,691,978 A | 11/1997 | Kenworthy |
| 5,781,084 A | 7/1998 | Rhodes |
| 6,178,310 B1 | 1/2001 | Jeong |
| 6,194,980 B1 | 2/2001 | Thon |
| 6,229,992 B1 | 5/2001 | McGeehan et al. |
| 6,262,637 B1 | 7/2001 | Bradley et al. |
| 6,297,711 B1 | 10/2001 | Seward et al. |
| 6,496,061 B1 | 12/2002 | Bloom |
| 6,580,729 B1 | 6/2003 | Grandchamp et al. |
| 6,721,544 B1 | 4/2004 | Franca-Neto |
| 6,819,302 B2 | 11/2004 | Volman |
| 6,946,847 B2 | 9/2005 | Nishimori et al. |
| 7,072,614 B1 | 7/2006 | Kasperkovitz |
| 7,116,966 B2 | 10/2006 | Hattori et al. |
| 7,123,883 B2 | 10/2006 | Mages |
| 7,250,830 B2 | 7/2007 | Layne et al. |
| 7,283,793 B1 | 10/2007 | McKay |
| 7,330,500 B2 | 2/2008 | Kouki |
| 7,369,811 B2 | 5/2008 | Bellatoni et al. |
| 7,623,005 B2 | 11/2009 | Johansson et al. |
| 7,633,435 B2 | 12/2009 | Meharry et al. |
| 7,636,388 B2 | 12/2009 | Wang et al. |
| 7,711,329 B2 | 5/2010 | Aparin et al. |
| 7,804,383 B2 | 9/2010 | Volatier et al. |
| 7,894,779 B2 | 2/2011 | Meiyappan et al. |
| 8,013,690 B2 | 9/2011 | Miyashiro |
| 8,135,348 B2 | 3/2012 | Aparin |
| 8,149,742 B1 | 4/2012 | Sorsby |
| 8,199,681 B2 | 6/2012 | Zinser et al. |
| 8,385,871 B2 | 2/2013 | Wyville |
| 8,422,412 B2 | 4/2013 | Hahn |
| 8,514,035 B2 | 8/2013 | Mikhemar et al. |
| 8,600,329 B1 | 12/2013 | Comeau et al. |
| 8,620,246 B2 | 12/2013 | McKinzie et al. |
| 8,749,321 B2 | 6/2014 | Kim et al. |
| 8,761,026 B1 | 6/2014 | Berry et al. |
| 8,942,657 B2 | 1/2015 | McKinzie et al. |
| 8,957,742 B2 | 2/2015 | Spears et al. |
| 9,048,805 B2 | 6/2015 | Granger et al. |
| 9,214,718 B2 | 12/2015 | Mow et al. |
| 9,450,553 B2 | 9/2016 | Langer et al. |
| 9,479,214 B2 | 10/2016 | Webb et al. |
| 9,490,866 B2 | 11/2016 | Goel et al. |
| 9,500,727 B2 | 11/2016 | Sohn et al. |
| 9,543,630 B2 | 1/2017 | Tokumitsu et al. |
| 9,590,794 B2 | 3/2017 | Behnam et al. |
| 2002/0089396 A1 | 7/2002 | Noguchi et al. |
| 2003/0109077 A1 | 6/2003 | Kim et al. |
| 2004/0000425 A1 | 1/2004 | White et al. |
| 2004/0127178 A1 | 7/2004 | Kuffner |
| 2004/0180633 A1 | 9/2004 | Nakatani et al. |
| 2005/0070232 A1 | 3/2005 | Mages |
| 2005/0245213 A1 | 11/2005 | Hirano et al. |
| 2005/0289632 A1 | 12/2005 | Brooks |
| 2006/0019611 A1 | 1/2006 | Mages |
| 2007/0105509 A1 | 5/2007 | Muhammad |
| 2008/0128901 A1 | 6/2008 | Zurcher et al. |
| 2008/0227409 A1 | 9/2008 | Chang et al. |
| 2008/0240000 A1 | 10/2008 | Kidd |
| 2008/0261519 A1 | 10/2008 | Demarco et al. |
| 2009/0054008 A1 | 2/2009 | Satou |
| 2009/0121797 A1 | 5/2009 | Karabatsos |
| 2009/0125253 A1 | 5/2009 | Blair et al. |
| 2009/0221258 A1* | 9/2009 | Steinbuch ............ H03D 9/0633 |
| | | 455/326 |
| 2009/0252252 A1 | 10/2009 | Kim et al. |
| 2009/0253385 A1 | 10/2009 | Dent et al. |
| 2009/0289744 A1 | 11/2009 | Miyashiro |
| 2010/0002620 A1 | 1/2010 | Proctor et al. |
| 2010/0084146 A1 | 4/2010 | Roberts |
| 2010/0109771 A1 | 5/2010 | Baik et al. |
| 2010/0127795 A1 | 5/2010 | Bauer et al. |
| 2010/0134700 A1 | 6/2010 | Robert et al. |
| 2010/0148886 A1 | 6/2010 | Inoue et al. |
| 2010/0177917 A1 | 7/2010 | Van Der Werf |
| 2010/0323654 A1 | 12/2010 | Judson et al. |
| 2011/0032079 A1* | 2/2011 | Bloy ...................... G06K 7/01 |
| | | 340/10.1 |
| 2011/0069644 A1 | 3/2011 | Kim et al. |
| 2011/0080229 A1 | 4/2011 | Kennington |
| 2011/0080856 A1 | 4/2011 | Kenington |
| 2011/0134810 A1 | 6/2011 | Yamamoto et al. |
| 2011/0140803 A1 | 6/2011 | Kim et al. |
| 2011/0227664 A1 | 9/2011 | Wyville |
| 2011/0256857 A1 | 10/2011 | Chen et al. |
| 2012/0007605 A1 | 1/2012 | Benedikt |
| 2012/0063496 A1 | 3/2012 | Giannini et al. |
| 2012/0075069 A1 | 3/2012 | Dickey et al. |
| 2012/0094617 A1 | 4/2012 | Tone et al. |
| 2012/0099624 A1 | 4/2012 | Nagaya et al. |
| 2012/0140860 A1 | 6/2012 | Rimini et al. |
| 2012/0154071 A1 | 6/2012 | Bradley et al. |
| 2012/0161784 A1 | 6/2012 | Benedikt |
| 2012/0163245 A1 | 6/2012 | Tone et al. |
| 2012/0194269 A1 | 8/2012 | Schlager |
| 2012/0201153 A1 | 8/2012 | Bharadia et al. |
| 2012/0201173 A1 | 8/2012 | Jain et al. |
| 2012/0212304 A1 | 8/2012 | Zhang et al. |
| 2012/0230227 A1 | 9/2012 | Weiss |
| 2013/0010654 A1* | 1/2013 | Kushnir ................ H01P 1/213 |
| | | 370/277 |
| 2013/0016634 A1 | 1/2013 | Smiley |
| 2013/0063299 A1 | 3/2013 | Proudkii |
| 2013/0065542 A1 | 3/2013 | Proudkii |
| 2013/0079641 A1 | 3/2013 | Zwirn |
| 2013/0083703 A1* | 4/2013 | Granger-Jones ....... H04B 1/525 |
| | | 370/277 |
| 2013/0109330 A1 | 5/2013 | Sahota et al. |
| 2013/0113576 A1 | 5/2013 | Inoue et al. |
| 2013/0130619 A1 | 5/2013 | Harverson et al. |
| 2013/0154887 A1 | 6/2013 | Hein et al. |
| 2013/0190036 A1* | 7/2013 | Zhao ..................... H03F 1/0277 |
| | | 455/550.1 |
| 2013/0201880 A1* | 8/2013 | Bauder .................... H03H 7/48 |
| | | 370/277 |
| 2013/0201881 A1 | 8/2013 | Bauder et al. |
| 2013/0201882 A1 | 8/2013 | Bauder et al. |
| 2013/0222059 A1 | 8/2013 | Kilambi et al. |
| 2013/0241655 A1 | 9/2013 | Liss et al. |
| 2013/0241656 A1 | 9/2013 | Tajima et al. |
| 2013/0241669 A1 | 9/2013 | Mikhemar et al. |
| 2013/0242809 A1 | 9/2013 | Tone et al. |
| 2013/0245976 A1 | 9/2013 | Hind |
| 2013/0287144 A1 | 10/2013 | Paulin et al. |
| 2013/0301488 A1 | 11/2013 | Hong et al. |
| 2013/0321097 A1 | 12/2013 | Khlat et al. |
| 2014/0103946 A1 | 4/2014 | Vanden Bossche |
| 2014/0140860 A1 | 5/2014 | Tibbott et al. |
| 2014/0154981 A1* | 6/2014 | Nakatani ............ H01L 23/5227 |
| | | 455/41.1 |
| 2014/0169236 A1 | 6/2014 | Choi et al. |
| 2014/0194073 A1 | 7/2014 | Wyville et al. |
| 2014/0204808 A1 | 7/2014 | Choi et al. |
| 2014/0348018 A1 | 11/2014 | Bharadia et al. |
| 2014/0376419 A1 | 12/2014 | Goel et al. |
| 2015/0049841 A1 | 2/2015 | Laporte et al. |
| 2015/0118978 A1 | 4/2015 | Khlat |
| 2015/0163044 A1 | 6/2015 | Analui et al. |
| 2015/0236390 A1 | 8/2015 | Analui et al. |

(56) References Cited

U.S. PATENT DOCUMENTS

| | | | |
|---|---|---|---|
| 2015/0236395 | A1 | 8/2015 | Analui et al. |
| 2015/0236842 | A1 | 8/2015 | Goel et al. |
| 2016/0050031 | A1 | 2/2016 | Hwang et al. |
| 2016/0134325 | A1 | 5/2016 | Tageman et al. |
| 2016/0204821 | A1 | 7/2016 | Han et al. |
| 2016/0211870 | A1 | 7/2016 | Wu et al. |
| 2016/0379744 | A1* | 12/2016 | Vaesen .......... H01P 5/028 336/170 |
| 2016/0380706 | A1 | 12/2016 | Tanzi et al. |
| 2017/0030339 | A1 | 2/2017 | Proudfoot |
| 2017/0070368 | A1 | 3/2017 | Mandegaran |
| 2018/0309464 | A1 | 10/2018 | Mandegaran |

FOREIGN PATENT DOCUMENTS

| | | | |
|---|---|---|---|
| DE | 102012107877 | A1 | 2/2014 |
| EP | 1091497 | A1 | 4/2001 |
| EP | 2733855 | A1 | 5/2014 |
| EP | 2814172 | A1 | 12/2014 |
| EP | 2960981 | A1 | 12/2015 |
| JP | 2012089995 | A | 5/2012 |
| JP | 2012095058 | A | 5/2012 |
| KR | 10-2010-0134324 | A | 12/2010 |
| WO | 9515018 | A1 | 6/1995 |
| WO | 0052841 | A1 | 9/2005 |
| WO | 2014032883 | A1 | 3/2014 |
| WO | 2014133625 | A2 | 9/2014 |
| WO | 2015089091 | A1 | 6/2015 |
| WO | 2016063108 | A1 | 4/2016 |

OTHER PUBLICATIONS

Office Action for U.S. Appl. No. 14/626,572, dated Jul. 15, 2016.
Office Action for U.S. Appl. No. 14/622,627, dated May 20, 2016.
Office Action for U.S. Appl. No. 14/626,572, dated Mar. 31, 2016.
ISR for Application No. PCT/US2016/050466, dated Nov. 29, 2016.
Office Action for U.S. Appl. No. 14/626,572, dated Jul. 29, 2015.
ISR and Written Opinion for PCT Application No. PCT/US2015/016642, dated Jun. 25, 2015.
Hunter et al., "Passive Microwave Receive Filter Networks Using Low-Q Resonators," IEEE Microwave Magazine, pp. 46-53, (2005).
Laforge et al., "Diplexer design implementing highly miniaturized multilayer superconducting hybrids and filters," IEEE Transactions on Applied Superonductivity, pp. 47-54, (2009).
Marcatili et al., "Band-Splitting Filter," Bell System Technical Journal, pp. 197-212, (1961).
Matthaei et al., "Microwave Filters, Impedance-Matching Networks, and Coupling Structures," Chapter 14: Directional, Channel-Separation Filters and Traveling-WAve Ring-Resonators, pp. 843-887, Copyright 1980 Artech House, Inc., Dedham, MA; reprint of edition published by McGraw-Hill Book Company, 1964.
Matthaei et al., "Microwave Filters, Impedance-Matching Networks, and Coupling Structures," Chapter 16: Multiplexer Design, pp. 965-1000, Copyright 1980 Artech House, Inc., Dedham, MA; reprint of edition published by McGraw-Hill Book Company, 1964.
Phudpong et al., "Nonlinear Matched Reflection Mode and stop Filters for Frequency Selective Limiting Applications," Microwave Symposium Conference, IEEE/MTT-S International, pp. 1043-1046, (2007).
ISR and Written Opinion for PCT/US2014/069372, dated Mar. 3, 2015.
ISR and Written Opinion for PCT/US2015/016145, dated May 20, 2015.
ISR and Written Opinion for PCT/US2015/015930, dated May 27, 2015.
Korean International Searching Authority, ISR and Written Opinion for PCT/US2013/074155, dated Sep. 23, 2014.
Kannangara et al., "Analysis of an Adaptive Wideband Duplexer With Double-Loop Cancellation," IEEE Transactions on Vehicular Technology, vol. 56, No. 4, pp. 1761-1982, (2007).
Notice of Allowance for U.S. Appl. No. 14/102,244, dated Jul. 20, 2016.
Office Action for U.S. Appl. No. 14/102,244, dated Sep. 22, 2015.
Office Action for U.S. Appl. No. 14/102,244, dated Jun. 15, 2015.
ISR and Written Opinion for PCT/2016/054646, dated Dec. 29, 2016.
Notice of Allowance for U.S. Appl. No. 15/528,876, dated Jul. 3, 2019, 8 pages.
Notification of the First Office Action for Chinese Patent Application No. 201680059896.8, dated Apr. 2, 2019, 11 pages.
Notification of the Second Office Action for Chinese Patent Application No. 201580009478.3, dated Jul. 17, 2019, 11 pages.
Notice of Allowance for U.S. Appl. No. 14/624,289, dated Sep. 11, 2019, 8 pages.
Notice of Allowance for U.S. Appl. No. 16/512,550, dated Aug. 27, 2019, 9 pages.
Notification of the First Office Action for Chinese Patent Application No. 2017900013920, dated Sep. 27, 2019, 5 pages.
Notice of Allowance for U.S. Appl. No. 16/662,864, dated Dec. 9, 2019, 7 pages.
Office Action for Chinese Patent Application No. 2016800598968, dated Dec. 23, 2019, 13 pages.
Notice of Allowance for U.S. Appl. No. 16/663,542, dated Jan. 31, 2020, 8 pages.
International Preliminary Report on Patentability for International Patent Application No. PCT/US2013/074155, dated Jun. 25, 2015, 7 pages.
International Preliminary Preliminary Report on Patentability for International Patent Application No. PCT/US2014/069372, dated Jun. 23, 2016, 8 pages.
International Preliminary Report on Patentability for International Patent Application No. PCT/US2015/015930, dated Aug. 25, 2016, 8 pages.
International Preliminary Report on Patentability for International Patent Application No. PCT/US2015/016145, dated Aug. 25, 2016, 6 pages.
International Preliminary Report on Patentability for International Patent Application No. PCT/US2015/016642, dated Sep. 1, 2016, 9 pages.
International Preliminary Report on Patentability for International Patent Application No. PCT/US2016/54646, dated Oct. 5, 2017, 5 pages.
International Preliminary Report on Patentability for International Patent Application No. PCT/US2017/052699, dated Apr. 4, 2019, 8 pages.
Notification of Reasons for Refusal for Japanese Patent Application No. 2015-547473, dated Mar. 2, 2017, 6 pages.
The First Office Action for Chinese Patent Application No. 201480067651.0, dated Jun. 22, 2018, 27 pages.
The First Office Action for Chinese Patent Application No. 201580009478.3, dated Dec. 27, 2018, 34 pages.
Notice of Allowance for U.S. Appl. No. 14/565,752, dated Nov. 4, 2016, 7 pages.
Notice of Allowance for U.S. Appl. No. 14/622,627, dated Feb. 16, 2017, 7 pages.
Notice of Allowance for U.S. Appl. No. 14/622,627, dated Aug. 14, 2017, 7 pages.
Non-Final Office Action for U.S. Appl. No. 14/624,289, dated Nov. 4, 2016, 13 pages.
Final Office Action for U.S. Appl. No. 14/624,289, dated Mar. 3, 2017, 17 pages.
Non-Final Office Action for U.S. Appl. No. 14/624,289, dated Aug. 10, 2017, 23 pages.
Final Office Action for U.S. Appl. No. 14/624,289, dated Mar. 30, 2018, 19 pages.
Notice of Allowance for U.S. Appl. No. 14/624,289, dated Feb. 19, 2019, 7 pages.
Non-Final Office Action for U.S. Appl. No. 14/626,572, dated Jul. 29, 2015, 22 pages.
Final Office Action for U.S. Appl. No. 14/626,572, dated Feb. 16, 2017, 12 pages.
Notice of Allowance for U.S. Appl. No. 15/528,876, dated Nov. 7, 2018, 8 pages.

(56) References Cited

OTHER PUBLICATIONS

Notice of Allowance for U.S. Appl. No. 15/528,876, dated Mar. 6, 2019, 9 pages.
PCT, Notification of Transmittal of the International, Search Report and the Written Opinion of the International Searching Authority, or the Declaration, in Application No. PCT/US2017/052699, dated Dec. 4, 2017 (14 pages).
Official Letter for Taiwanese Patent Application No. 105132721, dated Apr. 6, 2020, 16 pages.

* cited by examiner

ENHANCING ISOLATION IN HYBRID-BASED RADIO FREQUENCY DUPLEXERS AND MULTIPLEXERS

CROSS-REFERENCE TO RELATED APPLICATIONS/INCORPORATION BY REFERENCE

This patent application makes reference to, claims priority to, and claims benefit from U.S. Provisional Application No. 62/397,727, filed on Sep. 21, 2016.

FIELD OF THE DISCLOSURE

Certain embodiments of the present disclosure relate to radio frequency (RF) duplexers that may be used in wireless communication systems, for example. More specifically, certain embodiments of the disclosure relate to a method and system for enhancing isolation in hybrid-based RF duplexers and multiplexers.

BACKGROUND OF THE DISCLOSURE

Existing methods and systems for enhancing isolation in hybrid-based RF duplexers and multiplexers can be costly, cumbersome and inefficient. Further limitations and disadvantages of conventional and traditional approaches will become apparent to one of skill in the art, through comparison of such systems with the present disclosure as set forth in the remainder of the present application with reference to the drawings.

BRIEF SUMMARY OF THE DISCLOSURE

A system and/or method for enhancing isolation in hybrid-based radio frequency (RF) duplexers and multiplexers, substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

BRIEF DESCRIPTION OF SEVERAL VIEWS OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF THE DISCLOSURE

Figure 1:
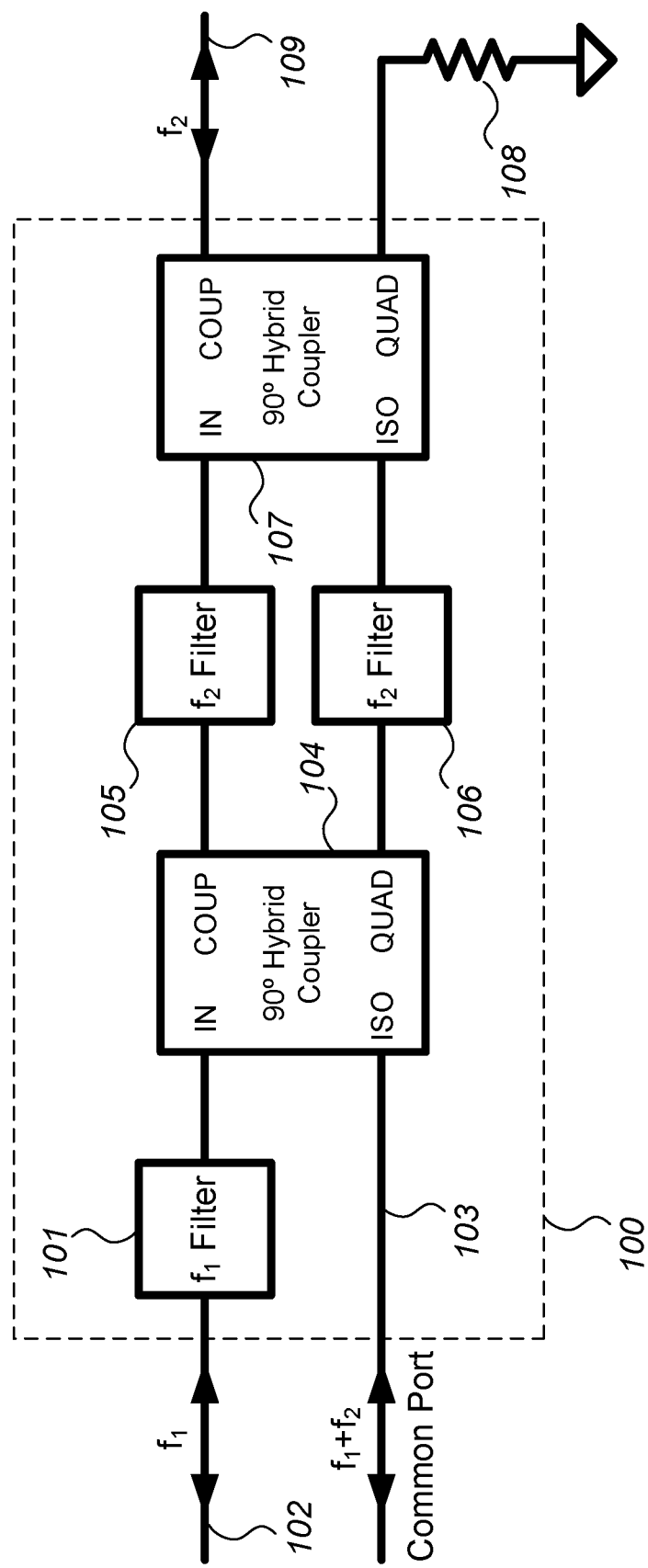
FIG. 1 illustrates a schematic of an embodiment of an RF duplexer according to the present disclosure.

As utilized herein the terms "circuit" and "circuitry" refer to physical electronic components (i.e., hardware) and any software and/or firmware ("code") which may configure the hardware, be executed by the hardware, and/or otherwise be associated with the hardware. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the term "exemplary" means serving as a non-limiting example, instance, or illustration. As utilized herein, the terms "e.g." and "for example" set off lists of one or more non-limiting examples, instances, or illustrations.

The components, steps, features, objects, benefits and advantages which have been discussed are merely illustrative. None of them, nor the discussions relating to them, are intended to limit the scope of protection in any way. Numerous other embodiments are also contemplated. These include embodiments which have fewer, additional, and/or different components, steps, features, objects, benefits and advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

Illustrative embodiments are now described. Other embodiments may be used in addition or instead. Details that may be apparent to a person of ordinary skill in the art may have been omitted. Some embodiments may be practiced with additional components or steps and/or without all of the components or steps that are described.

Some embodiments according to the present disclosure provide RF duplexers and RF multiplexers that can be used in wireless communication systems including, for example, those that support Frequency Division Duplexing (FDD), multi-channel or multi-band communications, and carrier aggregation.

Some embodiments according to the present disclosure provide RF duplexers and RF multiplexers that are characterized by one or more of the following: a low insertion loss from each port to the common port, high port-to-port isolation, high linearity, an ability to handle large signals (power handling), a compact size, manufacturability, and a low cost.

Some embodiments according to the present disclosure contemplate that requirements for RF duplexers and RF multiplexers have become more stringent in light of new communication standards where frequency bands are closer to each other; the need to support multiple standards in one platform; cost- and footprint-sensitive platforms such as smartphones; and co-existing communication systems where multiple communication transmitters and receivers work simultaneously.

Due to linearity, noise, and power handling requirements, some embodiments according to the present disclosure contemplate using passive RF duplexers and RF multiplexers for some applications. Due to the selectivity and isolation requirements, some embodiments according to the present disclosure contemplate using high-order filters that employ high quality factor (Q) components in the RF duplexer and the RF multiplexer.

Some embodiments according to the present disclosure solve one or more of the following problems: high-Q components can be costly; components can be larger to increase their Q; and tunable components provide lower Q compared to non-tunable counterparts.

Some embodiments according to the present disclosure contemplate using various technologies to realize RF duplexers and RF multiplexers. For instance, handheld consumer wireless devices can use acoustic technologies such as Surface Acoustic Wave (SAW) and Bulk Acoustic Wave (BAW) technologies to realize RF duplexers and RF multiplexers. These technologies offer high-Q, compact RF resonators suitable for filters, duplexers, and multiplexers with limited, yet sufficient, power handling capabilities for handheld devices. Commercial wireless infrastructure platforms such as base stations, repeaters, access points, and routers may use either acoustic or dielectric resonators (e.g., air cavity or ceramic resonators) to realize highly-selective, low-loss, linear RF filters, RF duplexers, and RF multiplexers with higher isolation and power handling requirements.

Some embodiments according to the present disclosure support multiple frequency bands and wireless standards within the same platform (either handheld or infrastructure systems). Some embodiments according to the present disclosure provide reconfigurable or tunable radio frequency components such as filters, duplexers, and multiplexers, for example.

Some embodiments according to the present disclosure provide piezoelectric material that can be used to realize compact high-Q resonators. Crystal resonators can provide spectrally-pure oscillators. SAW resonators can provide compact low-loss selective RF filters and duplexers as well as oscillators. Further, BAW resonators can be used to construct high-performance RF filters and duplexers as well as oscillators. Ceramic resonators and micro-electro-mechanical system (MEMS) resonators with high quality factor can be used in frequency generation as well as filtering applications.

In some embodiments according to the present disclosure, RF SAW filters and RF duplexers can be used in wireless communications such as cellular phones, wireless local area network (WLAN) transceivers, global positioning system (GPS) receivers, cordless phones, wireless phones, mobile phones, smartphones, tablets, laptops, and so forth. RF SAW filters can be used as band-select filters, image-reject filters, intermediate frequency (IF) filters, transmitter noise or spur reduction filters, and so forth. An exemplary smartphone can have several SAW resonators, SAW filters, and SAW duplexers to support various communication systems and standards.

Some embodiments according to the present disclosure contemplate that BAW resonators can have a lower loss (or a higher Q) or are more compact, especially at higher frequencies, when compared with SAW resonators. RF filters and duplexers that use BAW resonators may benefit from a lower insertion loss, or a higher selectivity, or a smaller form factor when compared with RF filters and duplexers that use SAW resonators, especially at higher frequencies. Thin film bulk acoustic resonators (FBARs) are exemplary examples of BAW resonators.

Wireless communication standards designate many different operational frequency bands to support the increase in the overall wireless capacity and reach. For instance, cellular phone standards may include RF frequency bands that range from approximately 700 MHz to approximately 4000 MHz. Furthermore, in order to increase the overall wireless capacity, the frequency spacing between adjacent frequency bands or channels within the same application or different applications may be reduced. This may be done, for instance, by reducing the guard bands in the wireless standard or by placing the transmit and receive frequency bands in an FDD scheme closer to each other. As a result, some embodiments of the present disclosure provide RF filters and duplexers with higher selectivity. More selective RF filters and duplexers that utilize a given component or technology (e.g., SAW, BAW, etc.) might incur more in-band insertion loss. The higher RF filter or duplexer insertion loss may reduce the wireless receiver noise figure and sensitivity, increase the wireless transmitter power consumption or reduce the transmitted power, and/or deteriorate the overall performance of a communication system.

In commercial systems, some embodiments of the present disclosure contemplate that the choice of technology may depend on the technical performance, such as power consumption as well as economic and business considerations such as cost, size, and time to market. For instance, while one technology may offer a better performance compared with another technology, it may not be adopted for a commercial system that is cost sensitive. In the case of RF filters and duplexers, it may be desirable to use a technology that provides the lowest-cost and/or most-compact solution, as long as a predetermined performance criterion is met. In other words, a more expensive or larger solution may not be adopted, even if it offers a better performance as compared with an alternative solution that meets an acceptable performance level at a lower cost and/or size. For instance, while RF filters and duplexers that use BAW resonators may offer lower loss compared with RF filters and duplexers that use SAW resonators for a given set of specifications, the higher relative cost of BAW technology, as well as its relatively smaller number of suppliers, may disfavor their usage in certain applications and standards. Other considerations may include, for example, the ease of integration with the rest of the components in a communication system. For instance, there may be performance, business, or economic advantages to integrate RF filters and duplexers with low noise amplifiers (LNAs), power amplifiers (PAs), transmit/receive (T/R) or band-select switches, impedance matching networks, etc. A wireless communication device, such as a smartphone, can include a number of SAW filters and duplexers as well as a number of BAW filter and duplexers. Each SAW or BAW filter or duplexer may be used for a specific communication application, standard, or frequency band.

Some embodiments according to the present disclosure provide architectural solutions that enable realization of highly-selective, low-loss RF duplexers with high-isolation between transmit and receive bands. Specifically, some embodiments according to the present disclosure provide a lower cost or more compact technology within an innovative architecture that satisfies a comparable or better specification compared to what can be achieved using a more expensive or less compact technology. Exemplary embodiments might include replacing BAW duplexers with SAW duplexers using an innovative architecture, or replacing ceramic or cavity duplexers with BAW duplexers using an innovative architecture.

An exemplary method for designing acoustic resonator based filters and duplexers begins by deciding upon the number of resonators to be used which can depend on the required stopband rejection for the filters or the required isolation for the duplexers. The larger the number of resonators used in filter design, the larger may be the order of the filter and the sharper may be the filter roll-off around passband. Sharper filter roll-off may provide higher stopband rejection. Similarly, the number of resonators used in the transmit (TX) and receive (RX) filters of the duplexer may determine the total isolation from TX to RX. The larger the order of the TX and RX filters (e.g., the larger the number of resonators used in the filters), the larger may be the amount of isolation between TX and RX. Due to the limited quality factor of the acoustic resonators, the insertion loss in the filter and duplexer may be directly proportional to the number of the resonators used. In other words, the larger the order of the filter and the TX and RX filter, the larger may be the loss of the filter and duplexer, respectively. Some embodiments according to the present disclosure contemplate overcoming this insertion loss and isolation or stopband rejection tradeoff by incorporating hybrid couplers in the design of the filters and duplexers.

FIG. 1 shows a simplified block diagram schematic of an embodiment of an RF duplexer 100 according to the present disclosure. The RF duplexer 100 includes a common port 103 and two single-frequency ports 102 and 109. An $f_1$ filter 101 has a passband at frequency band $f_1$. $f_2$ filters 105 and 106 are similar and have passbands at frequency band $f_2$ and stopbands that include frequency band $f_1$. In an ideal structure, ports 102 and 109 are completely isolated due to symmetry. The transfer function between ports 109 and 103 follows that of the $f_2$ filters 105 and 106. The transfer function between ports 102 and 103 follows that of the $f_1$ filter 101 multiplied by the input reflection coefficient of $f_2$ filters 105 and 106. In an exemplary design, the input reflection coefficient of $f_2$ filters 105 and 106 is close to one outside of $f_1$ passband including $f_2$. Hence, in an exemplary design, the insertion loss between ports 102 and 103, within the $f_1$ filter passband, is equal or approximately equal to the insertion loss $f_1$ filter 101.

There are several non-idealities associated with the design of the RF duplexer 100 in FIG. 1. Some of these non-idealities and their effects on the RF duplexer 100 are described herein.

Practical quadrature hybrid couplers, such as quadrature hybrid couplers 104 and 107, demonstrate amplitude and phase mismatches at their ports. The scattering parameters of an ideal symmetric quadrature hybrid coupler may be expressed as $$[S] = \frac{-1}{\sqrt{2}} \begin{bmatrix} 0 & j & 1 & 0 \\ j & 0 & 0 & 1 \\ 1 & 0 & 0 & j \\ 0 & 1 & j & 0 \end{bmatrix}. \quad (1)$$

In such an ideal hybrid coupler, the insertion loss from port one to the through and coupled ports is −3 dB, i.e., $|S_{21}|=|S_{31}|=1/\sqrt{2}$, and the phase difference in the transfer functions between ports one and two, and ports one and three is 90°, i.e., $\angle S_{21} - \angle S_{31} = 90°$. However, in practice, neither condition holds; in other words, in a practical realization of a hybrid coupler, $|S_{21}| \neq |S_{31}|$ and $\angle S_{21} - \angle S_{31} \neq 90°$; these are referred to as amplitude mismatch and phase mismatch.

Another non-ideality of a quadrature hybrid coupler is the non-zero isolation between the otherwise ideally isolated ports. In an ideal duplexer described above, ports 2 and 3 are fully isolated as shown by $S_{23}=S_{32}=0$. However, in a practical RF duplexer, the isolation is often non-zero. Due to the non-zero isolation, the isolation deteriorates between ports 102 and 109. The insertion loss also deteriorates between ports 102 and 103, and between ports 103 and 109. For instance, due to non-zero isolation in the quadrature hybrid coupler 107, some of the signal at the port 109 might be lost in a termination 108 as opposed to reaching the common port 103. This provides higher insertion loss between ports 103 and 109. For instance, due to the non-zero isolation in the quadrature hybrid coupler 104, some of the $f_2$ signal component from the common port 103 may be leaked to the port 102 (e.g., only seeing attenuation of $f_1$ filter); this can translate into less isolation between the ports 102 and 109.

In practice, the $f_2$ filters 105 and 106 are not identical. Specifically, the input-output transfer functions as well as input reflection coefficients of $f_2$ filters 105 and 106 are not identical.

The combined effect of the amplitude and phase mismatch in the quadrature hybrid couplers 104 and 107, the non-zero isolation in the quadrature hybrid couplers 104 and 107, and the non-identical response of $f_2$ filters 105 and 106 may cause asymmetries in the RF duplexer 100. As such, ports 102 and 109 might not be completely isolated anymore. High isolation is desired in RF duplexers. For instance, the desired isolation between transmit and receive ports of a commercial RF duplexer for certain handheld devices may be over 50 dB, whereas the same specification for an infrastructure base station device may be over 75 dB.

Some embodiments according to the present disclosure provide solutions that increase the isolation and maintain a low insertion loss in the duplexer 100 under practical scenarios including, for example, the amplitude and phase mismatch in the quadrature hybrid couplers 104 and 107, the non-zero isolation of the quadrature hybrid couplers 104, 107, and/or the non-identical response of $f_2$ filters 105 and 106.

Figure 2A:
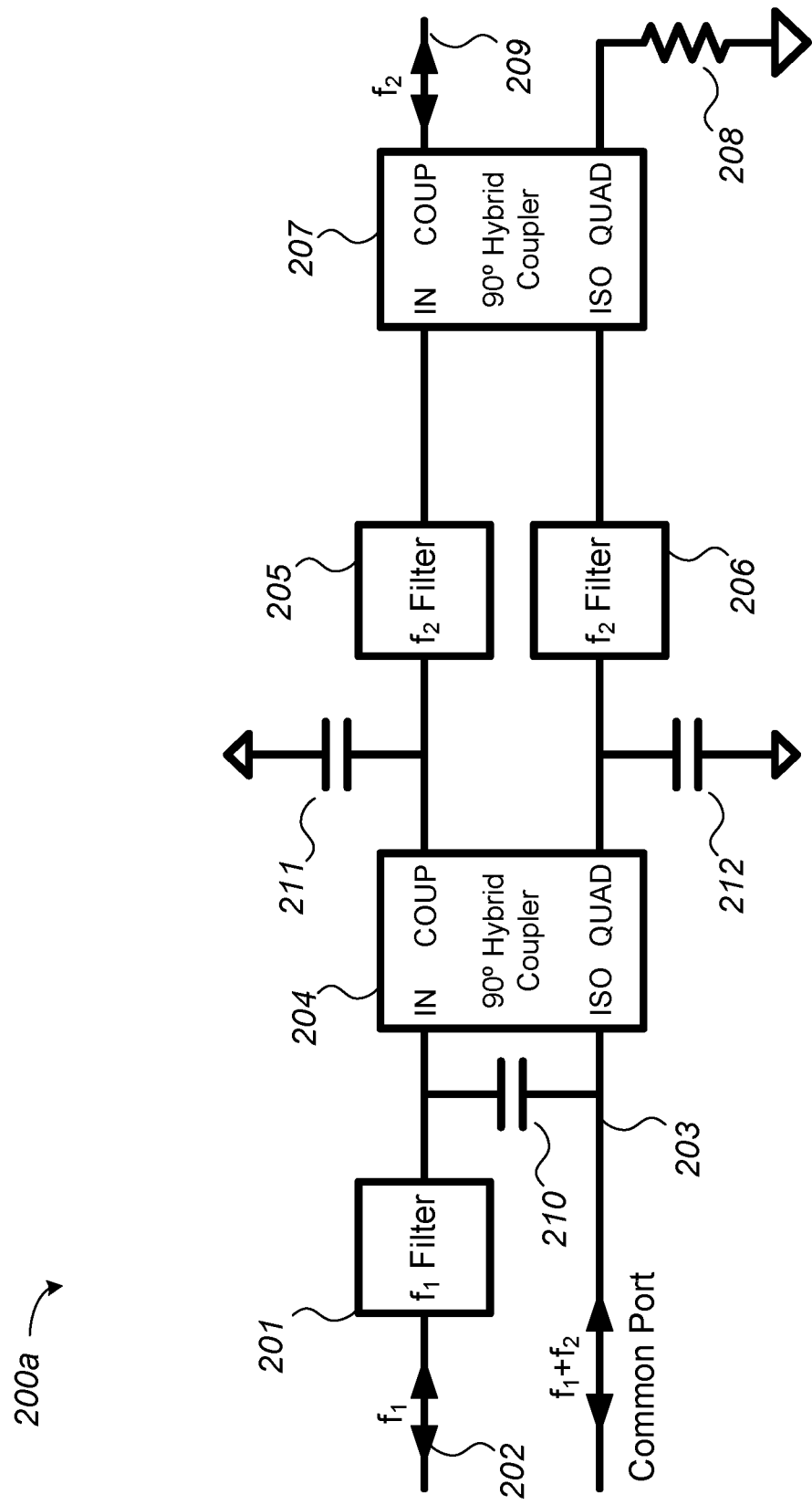
FIGS. 2A-2B illustrate block diagrams of embodiments of the RF duplexer according to the present disclosure.

FIG. 2A shows an embodiment of an RF duplexer 200a according to the present disclosure. The exemplary RF duplexer 200a adds capacitors 210, 211, and 212 to the RF duplexer 100 of FIG. 1. In some embodiments, only one or two of the aforementioned three capacitors 210, 211, and 212 are used. In other words, not all the three capacitors are needed to achieve a desired performance. For instance, some embodiments provide that the capacitor 210 is used without capacitors 211 and 212 to achieve a desired configuration and performance.

Any or all of capacitors 210, 211, and 212 may be realized within a package or a printed circuit board that includes the duplexer components so that it does not add to the overall cost or footprint. For instance, some or part of any of these capacitors 210, 211, and 212 may be realized through the capacitance of the interconnect lines.

In an exemplary embodiment, the capacitor 210 provides intentional coupling across the two hybrid ports that are otherwise meant to be isolated. This intentional coupling, when properly designed, can cancel out the effect of inherent unwanted coupling between these ports so that the overall duplexer isolation between ports 202 and 209 is enhanced. Some embodiments contemplate that a single capacitor 210 can enhance the duplexer isolation between ports 202 and 209 due to poor isolation in either of the quadrature hybrid couplers 204 or 207. In other exemplary embodiments, capacitor 210 can be placed on either side of the quadrature hybrid coupler 204 or on either side of the quadrature hybrid coupler 207.

Some embodiments provide that capacitors 211 and 212 can improve duplexer performance, especially the isolation between ports 202 and 209, in the presence of non-idealities, especially asymmetry caused by amplitude and phase mismatches in the quadrature hybrid couplers 204 and 207, and by the mismatch between $f_2$ filters 205 and 206. In some embodiments, the capacitors 211 and 212 can be placed on either side of the quadrature hybrid coupler 204 or on either side of the quadrature hybrid coupler 207. The values for the capacitors 211 and 212 may be different or the same. In some embodiments, only one of capacitors 211 and 212 is used to achieve a desired set of specifications.

Some embodiments contemplate that the value of the terminating impedance 208 provides another degree of freedom to enable high isolation between 202 and 209 ports. The impedance 208, ideally set to the terminating impedance of all the other ports at 50Ω, for example, may have to be different in a practical design due to the aforementioned non-idealities as well as the impedance mismatches at any of the ports. In a practical design, the impedance 208 may have both resistive and reactive components, for example.

Figure 2B:
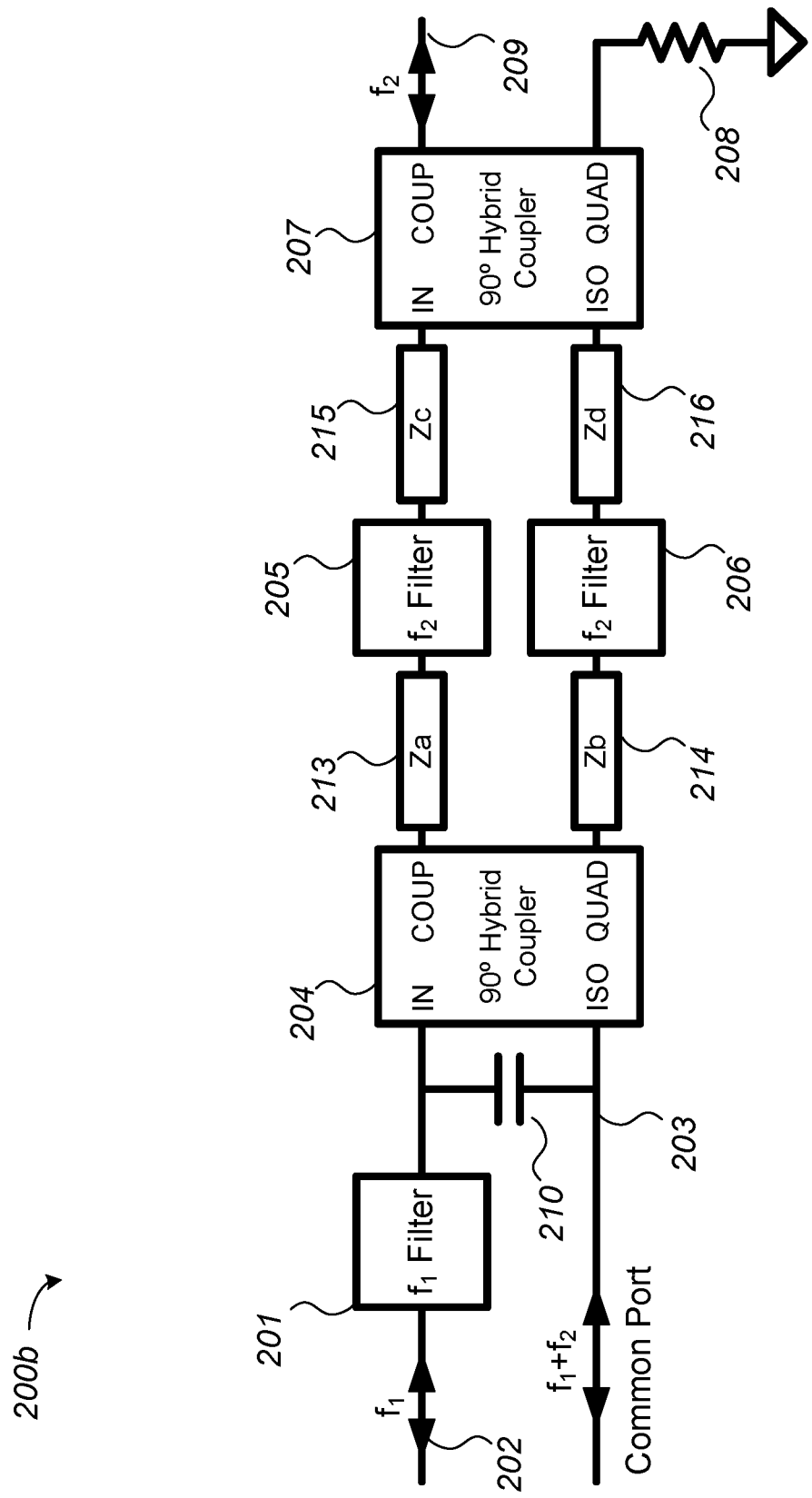

FIG. 2B shows another embodiment of the RF duplexer 200b according to the present disclosure. The exemplary RF Duplexer 200b uses transmission lines 213, 214, 215, and 216 instead of capacitors 211 and 212. Not all the transmission lines are needed in all implementations. Some or all of these transmission lines could have different impedances Za, Zb, Zc, Zd and lengths. The characteristic impedance and length of each transmission line may be set so that any of these transmission lines behaves like a capacitor or an inductor. The characteristic impedance and length of these transmission lines 211, 212, 213, 214 can be set to increase the isolation between ports 202 and 209 in the RF duplexer 200b. These transmission lines 211, 212, 213, 214 may be realized in various forms including, but not limited to, microstrips, coplanar striplines, coplanar waveguides, coaxial lines, etc. on any substrate including, but not limited to, printed circuit boards (PCB), ceramic substrates, etc.

Figure 3A:
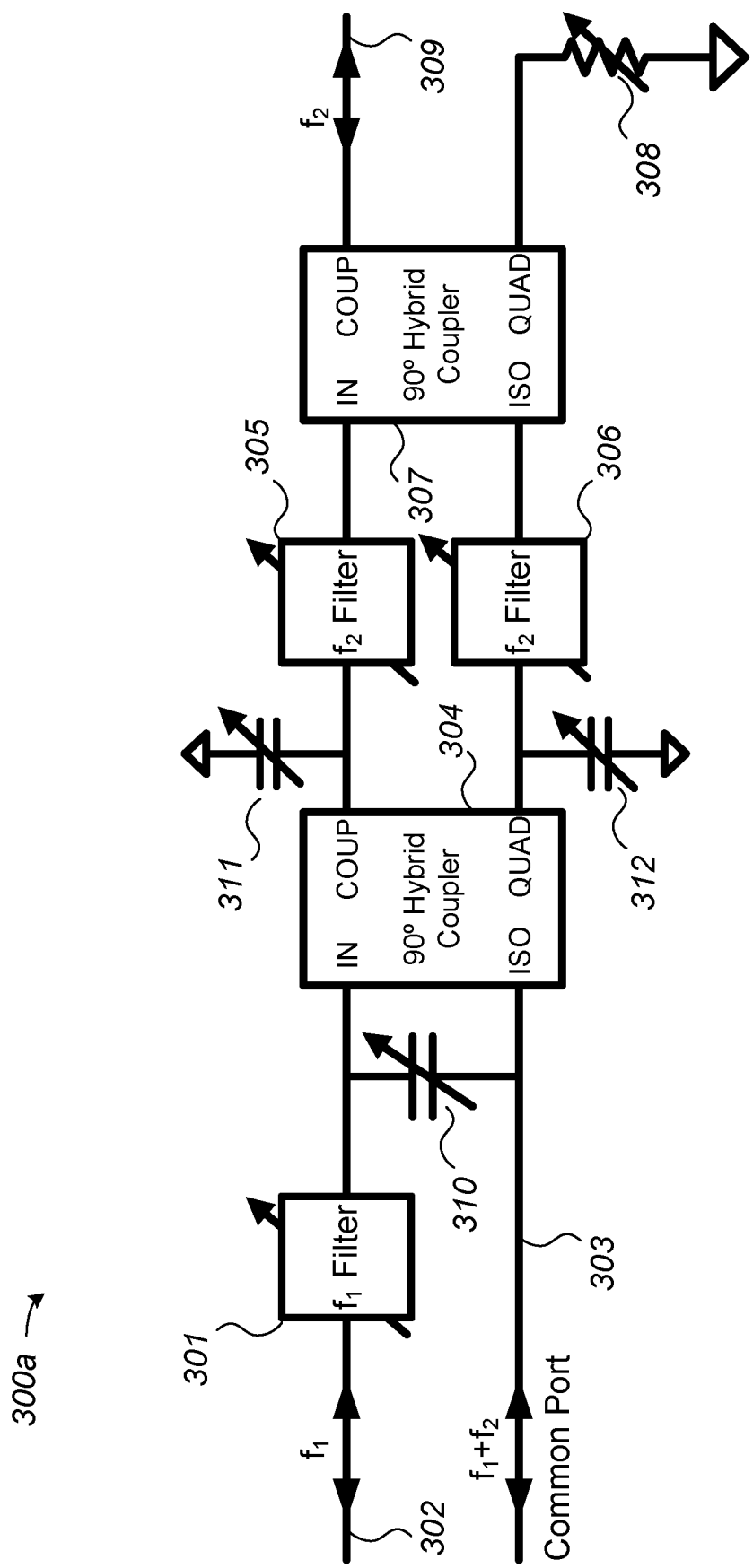
FIGS. 3A-3E illustrate block diagrams of embodiments of the RF duplexers according to the present disclosure.

FIG. 3A shows another embodiment of the RF duplexer 300a according to the present disclosure. The RF duplexer 300a provides for capacitors 310, 311, and 312 (e.g., tunable or reconfigurable capacitors) to be added to form a tunable or reconfigurable RF duplexer based, in part, on the design of the RF duplexer 100 of FIG. 1, where the $f_1$ filter 301 and/or the $f_2$ filters 305 and 306 are realized as tunable or reconfigurable filters. Any tunable or reconfigurable filter may be used in this scheme. In one embodiment, each tunable filter may comprise several fixed-frequency filters and one or more switches that select one of the fixed-frequency filters at a given time. In another embodiment, each tunable filter may comprise tunable components such as tunable capacitors or switched capacitors. The tunable filters 301, 305, 306 may comprise only passive elements, only active elements (e.g., components), or some combination of passive and active elements. Some embodiments provide that the tunable filters 301, 305, 306 are controlled through electrical stimuli. However, the internal mechanisms that make the filters tunable may be electrical, magnetic, electromagnetic, mechanical, chemical, etc. Quadrature hybrid couplers 304 and 307 may be fixed or tunable or reconfigurable in such a design. Tunable or reconfigurable RF duplexer 300a may enable realization of multi-band, multi-mode, multi-standard, or multi-function wireless communication systems. Specifically, the tunable or reconfigurable RF duplexer 300a may be realized at a lower cost or smaller form factor or with higher performance when compared with other solutions such as those requiring switching among multiple fixed RF duplexers. Satisfying low insertion loss and high isolation in the design of a tunable RF duplexer is more challenging when compared to a fixed RF duplexer design. This is due to the low quality factor of tunable components that are used in the tunable or reconfigurable filters. The non-idealities such as the amplitude and phase mismatch in the quadrature hybrid couplers 304 and 307, the non-zero isolation in the quadrature hybrid couplers 304 and 307, and the mismatch between the $f_2$ filters 305 and 306 are frequency dependent.

Furthermore, duplexer specifications including, for example, frequency bands $f_1$ and $f_2$, and insertion loss and isolation requirements may be different across different settings in a tunable/reconfigurable RF duplexer. In short, fixed values for capacitors 310, 311, and 312 might not be sufficient to satisfy the desired RF duplexer specifications for all the settings. Therefore, in a tunable or reconfigurable RF duplexer 300a, tunable or variable capacitors 310, 311, and 312 may be used. The values for the capacitors 310, 311, 312 can be selected to satisfy the RF duplexer specification across all the settings (e.g., different frequency bands of interest). Similar to the previous exemplary embodiment described above with respect to FIG. 2, not all the capacitors 310, 311, 312 may be necessary in a design. Furthermore, it might not be necessary that all of the capacitors 310, 311, 312 be tunable or variable. In some embodiments, any type of variable or tunable capacitor such as switched capacitors, varactors, etc. may be used. The tuning mechanism may be based on changing the dielectric constant of a capacitor, such as those using ferroelectric effects in materials such as Barium Strontium Titanate (BST); changing the distance or effective overlap of the capacitance plates; and/or changing the width of a depletion region or carrier density across or in a semiconductor junction, etc. Following the same discussions (e.g., the frequency dependency of the non-idealities), the terminating resistance 308 may also be tunable as shown in FIG. 3A. The control signals for any of the capacitors 310, 311, and 312 may be different or similar to each other, different or similar to control signals for any of the filters 301, 305, and 306, and different or similar to the control signal for the terminating impedance 308. However, the control signals for all the tunable components (e.g., filters, capacitors, and/or impedances) can be changed in tandem (e.g., concurrently, sequentially, etc.) to achieve the desired performance across all the tunable or reconfigurable duplexer settings.

Figure 3B:
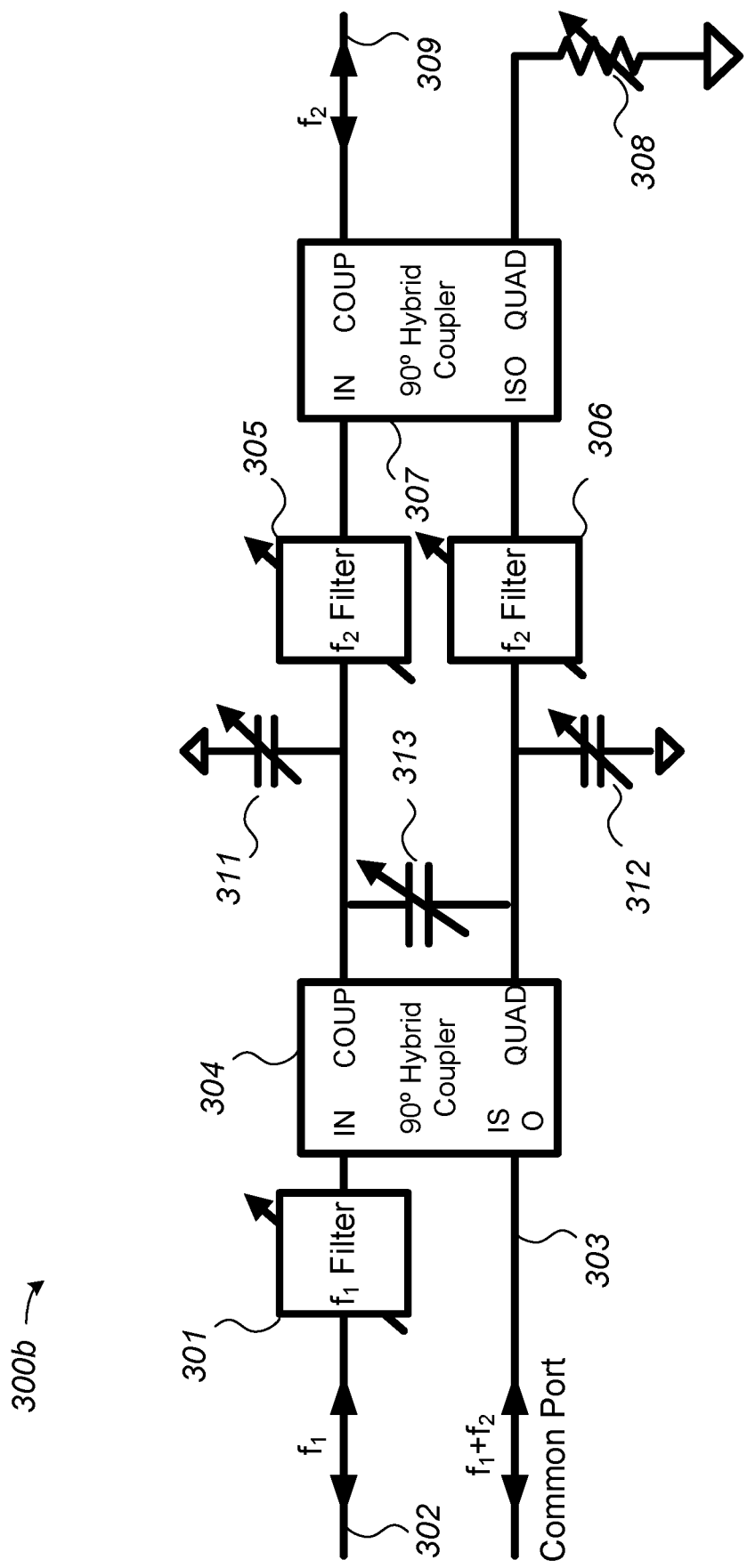
Figure 3C:
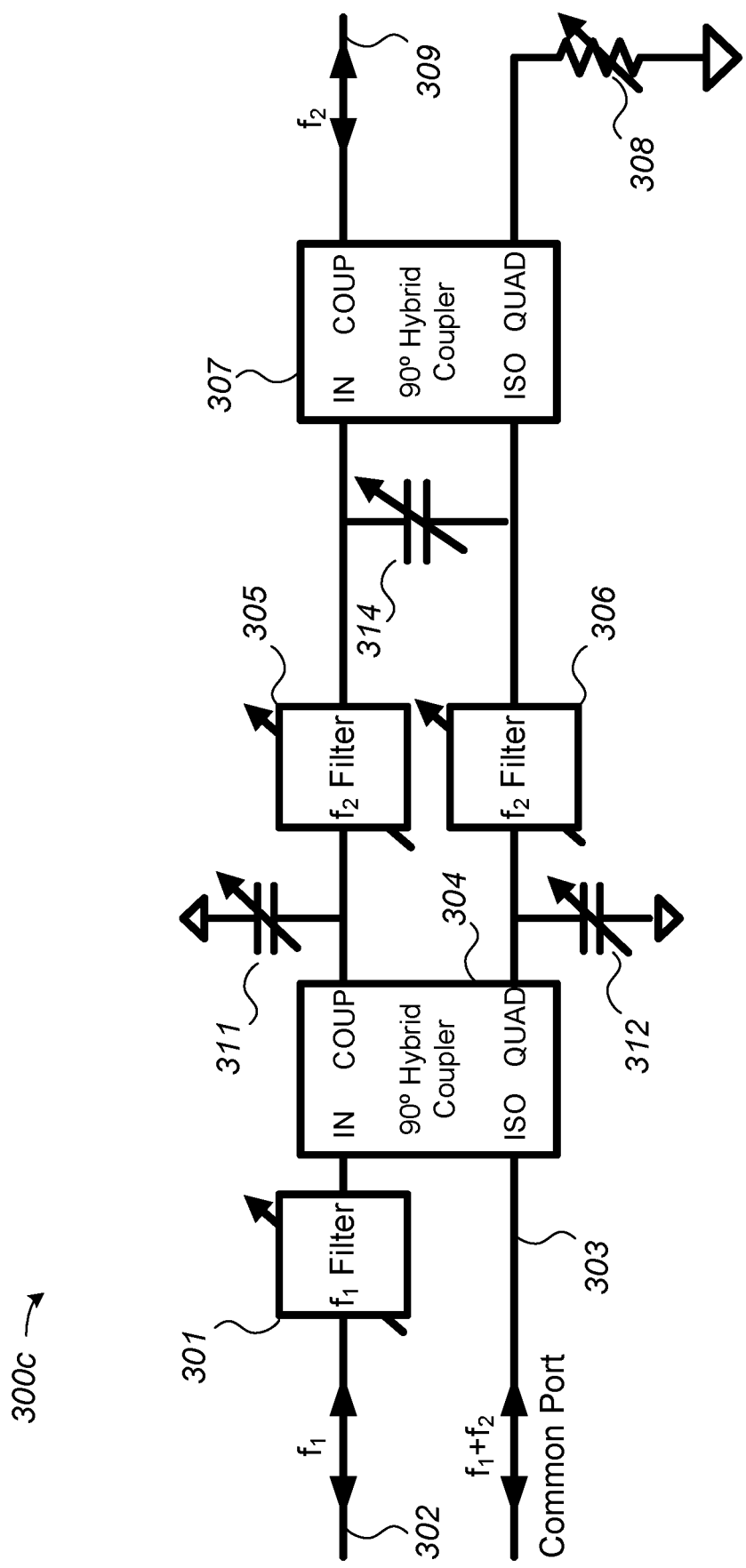
Figure 3D:
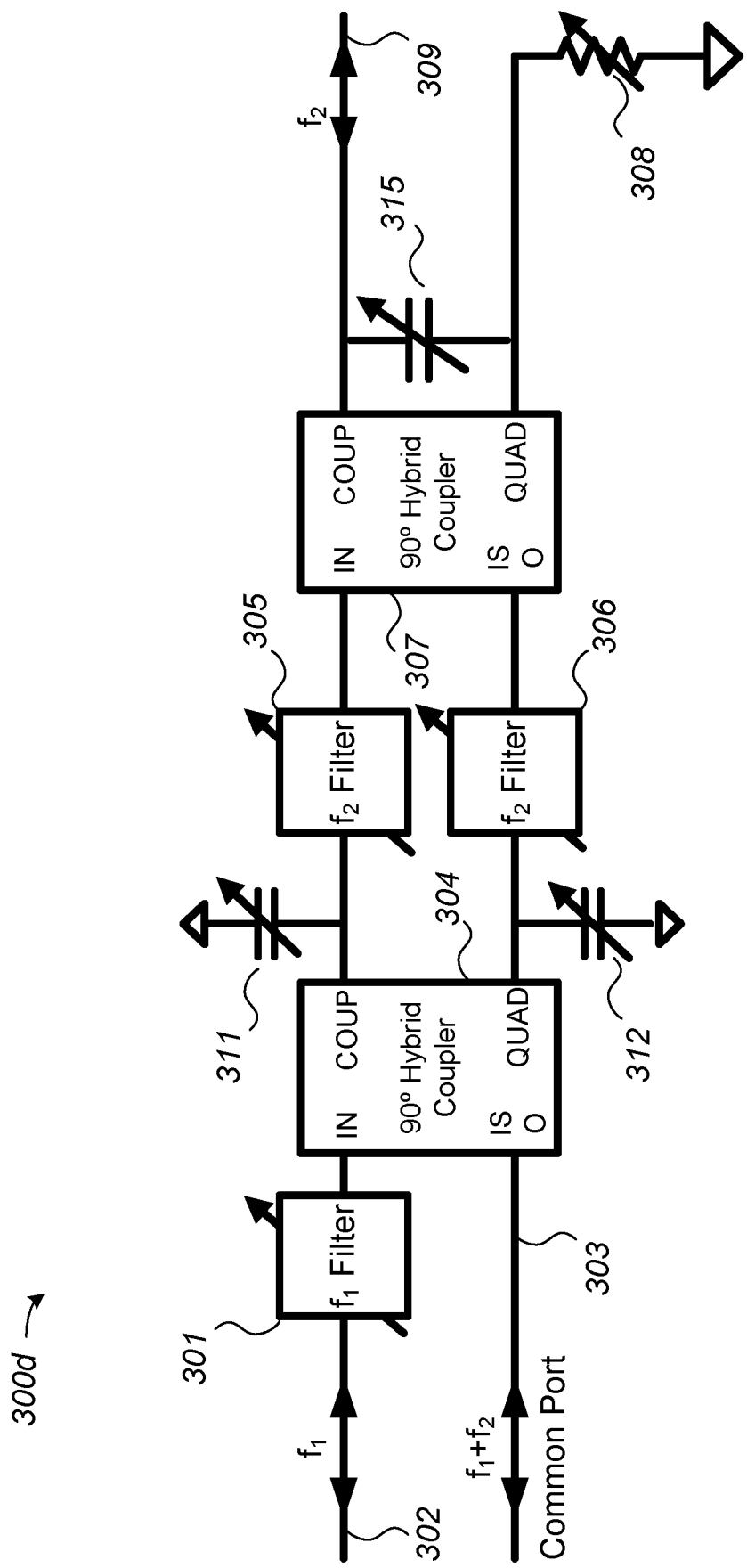

FIGS. 3B-3D show other embodiments of the RF duplexer according to the present disclosure. The RF duplexers 300b-300d provide that capacitors 313, 314, and 315 are placed across different sides of either of the quadrature hybrid couplers 304 and 307. As stated before, some embodiments contemplate that not all capacitors are needed in a particular design; likewise, not all capacitors have to be tunable or reconfigurable in a particular design.

Figure 3E:
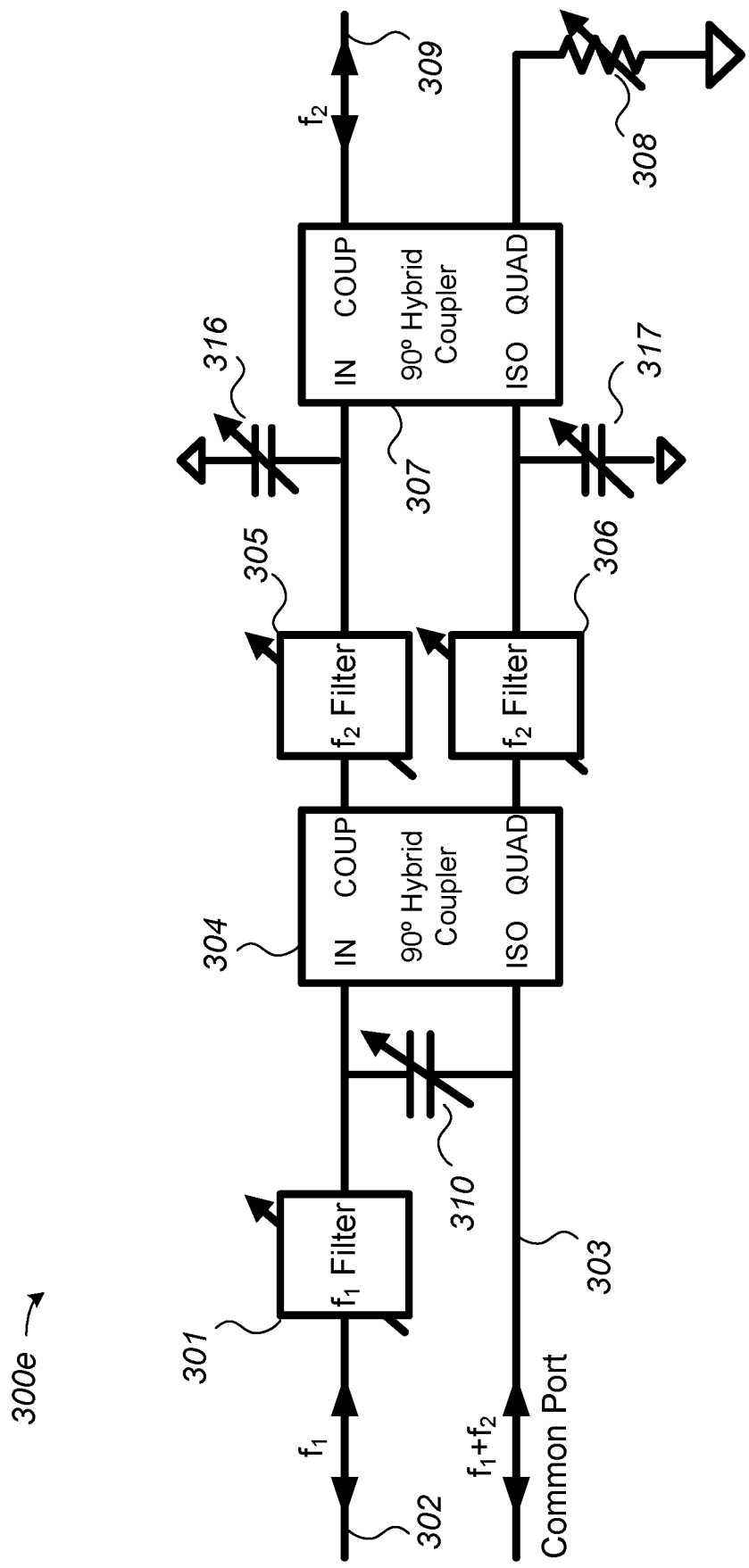

FIG. 3E shows another embodiment of the RF duplexer 300e according to the present disclosure. Unlike capacitors 311, 312 described above with respect to the RF duplexer 300a shown in FIG. 3A, RF duplexer 300e provides capacitors 316 and 317 at a different quadrature hybrid coupler, such as the quadrature hybrid coupler 307. Some embodiments provide that the tunable parallel capacitor across the quadrature hybrid coupler, such as the capacitor 310, may be placed across any side of either of the quadrature hybrid couplers 304, 307. Furthermore, the tunable parallel capacitors to ground (e.g., electrical ground, chassis ground, circuit ground, etc.), such as the capacitors 316, 317, may be placed at either side of either of the quadrature hybrid couplers 304, 307.

Figure 4:
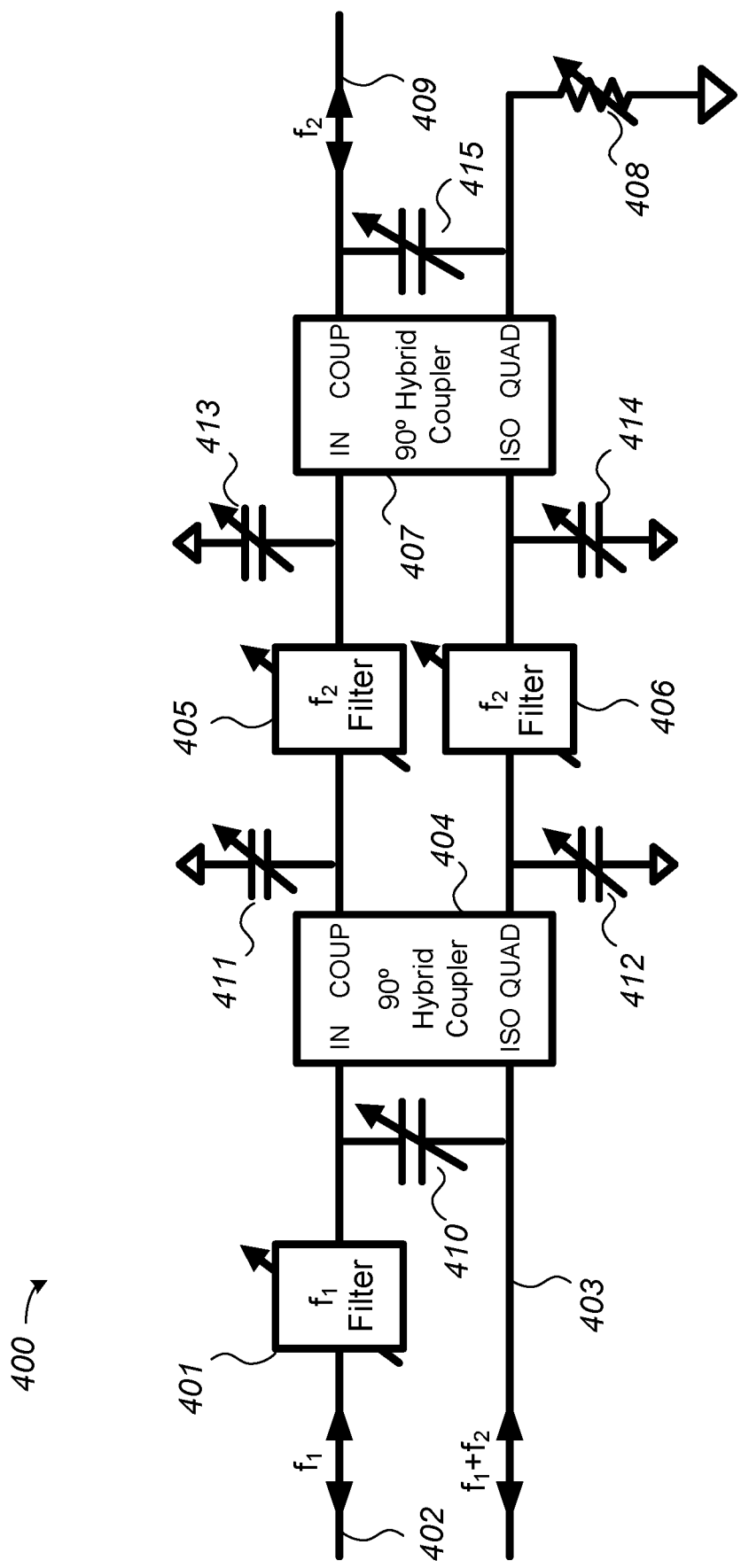
FIG. 4 illustrates a block diagram of an embodiment of the RF duplexer according to the present disclosure.

FIG. 4 shows another embodiment of the RF duplexer 400 according to the present disclosure. The RF duplexer 400 provides capacitors 410-415 (e.g., tunable or reconfigurable capacitors) as part of a tunable or reconfigurable RF duplexer. A tunable impedance 408 may also be included in the tunable or reconfigurable RF duplexer 400. In an exemplary embodiment, the tunable or reconfigurable RF duplexer 400 is configured to enhance the performance, for example, to enhance the isolation between ports 402 and 409, and/or reduce the insertion loss between ports 403 and 402, and between ports 403 and 409, in the presence of various non-idealities such as the frequency dependent amplitude and phase mismatch or the limited isolation in the quadrature hybrid couplers 404, 407, the frequency dependent mismatch between $f_2$ filters 405 and 406, etc.

Figure 5:
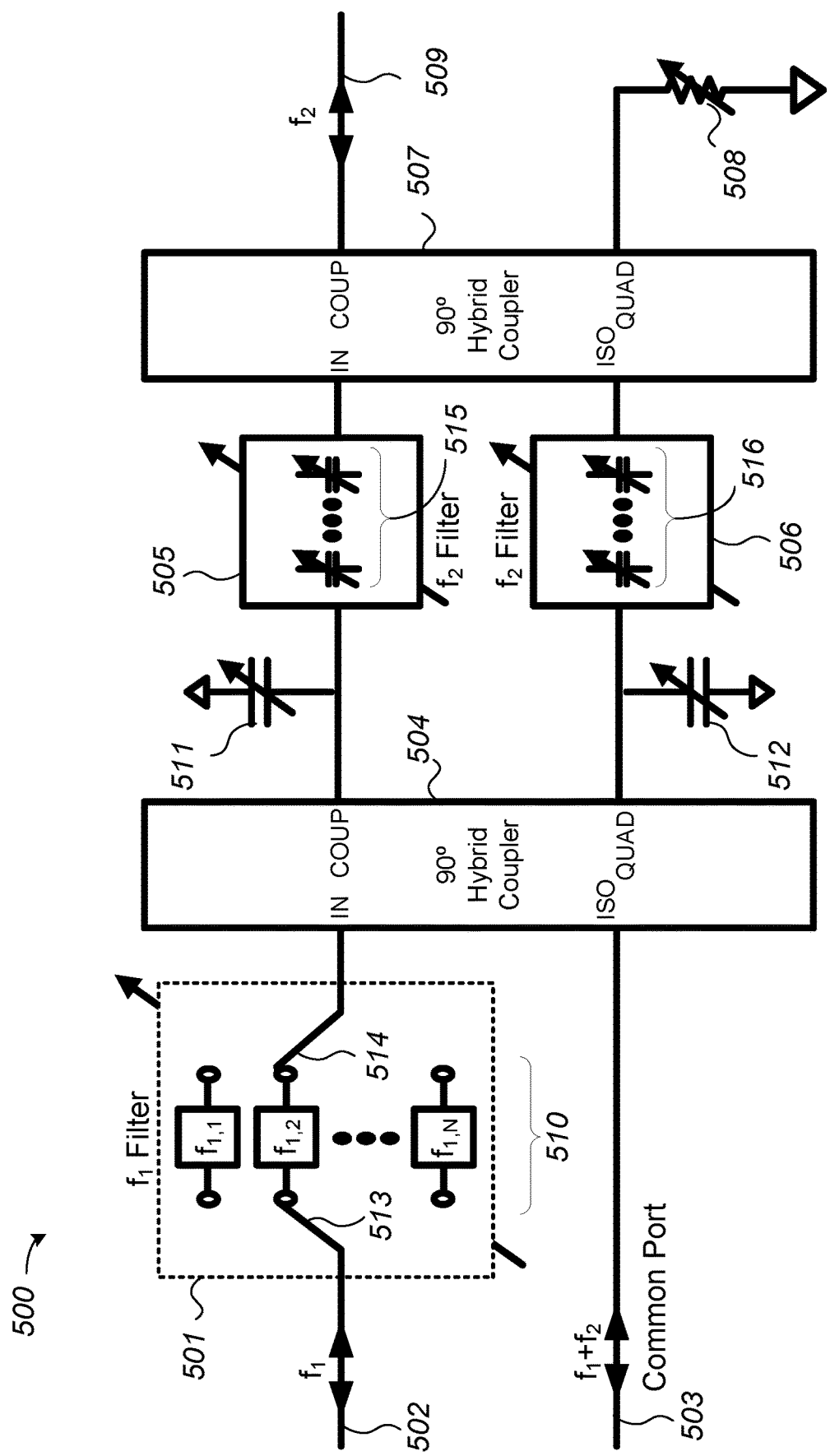
FIG. 5 illustrates a block diagram of an embodiment of the RF duplexer according to the present disclosure.

FIG. 5 shows another embodiment of the RF duplexer 500 according to the present disclosure. The RF duplexer 500 provides a tunable or reconfigurable RF duplexer. Referring to FIG. 5, tunable $f_1$ filter 501 is realized as a bank of fixed-frequency filters 510, with corresponding frequency bands $f_{1,1}$, $f_{1,2}$, ..., $f_{1,N}$, and a pair of switches 513, 514 to select one of the fixed-frequency filters 510 when appropriate. These fixed-frequency filters 510 may be constructed using various technologies such as, for example, surface acoustic wave (SAW) components, bulk acoustic wave (BAW) components, lumped circuit components, transmission lines and waveguides, dielectric or air cavity resonators, etc. Tunable $f_2$ filters 505 and 506 may include tunable capacitors such as varactors or switched capacitors that enable tunability or reconfigurability in their responses. These tunable $f_2$ filters 505 and 506 may include other components such as inductors, capacitors, and transmission lines, and may include components that operate based on electromagnetic or acoustic principles. Tunable capacitors 511 and 512 may enable maintaining high isolation between ports 502 and 509 in the presence of various non-idealities such as amplitude and phase mismatches in the quadrature hybrid couplers 504 and 507, mismatches between $f_2$ filters 505 and 506, mismatches in the layout, etc.

In some embodiments, the proper settings (e.g., desired settings) for the tunable capacitors 511 and 512 may be the same or different for different settings in the tunable or reconfigurable RF duplexer 500. The proper settings for tunable capacitors 511 and 512, along with those for tunable capacitors 515, 516 in the tunable $f_2$ filters 505 and 506, may be determined during assembly and testing of the RF duplexer 500. These settings may be stored in a memory (e.g., a non-transitory memory) for future use. The proper values for the tunable capacitors 511 and 512 may be determined through determination on duplexer performance metrics such as isolation or insertion loss.

In some embodiments, the proper settings for tunable capacitors 511 and 512, along with those for tunable capacitors 515, 516 in the tunable $f_2$ filters 505 and 506, may be determined by a wireless communication device that utilizes the RF duplexer 500. The control signals for the tunable $f_1$ filter 501, or the tunable $f_2$ filters 505 and 506, or the tunable capacitors 511 and 512 may be analog or digital signals. An analog control signal may be supplied through a digital-to-analog converter (DAC). The digital control signals, once determined, may be stored in a memory or register to be recalled later as needed.

Some embodiments of the RF duplexers according to the present disclosure may be used in handheld portable devices supporting wireless communications such as a mobile phones, cellular phones, smartphones, tablets, laptops, smartwatches, etc. Some embodiments of the RF duplexers according to the present disclosure may be used in devices supporting the wireless communication infrastructure such as base stations (including macro-, micro-, pico-, and femto-base stations), repeaters, etc. Some embodiments of the RF duplexers according to the present disclosure may enable compact multiband, multi-standard wireless communication devices, wireless communication devices that support carrier aggregation, and wireless communication devices that support frequency division duplexing (FDD).

Other embodiments of the disclosure may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform some or all of the steps as described herein for enhancing isolation in hybrid-based RF duplexers and multiplexers.

Accordingly, aspects of the present disclosure may be realized in hardware, software, or a combination of hardware and software. The present disclosure may be realized in a centralized fashion in at least one computer system or in a distributed fashion where different elements are spread across several interconnected computer systems. Any kind of computer system or other apparatus adapted for carrying out the methods described herein is suited. A combination of hardware and software may be a general-purpose computer system with a computer program that, when being loaded and executed, controls the computer system such that it carries out the methods described herein.

Aspects of the present disclosure may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

What is claimed is:

1. A radio frequency duplexer, comprising:
   a first port;
   a second port;
   a third port;
   a first quadrature hybrid coupler and a second quadrature hybrid coupler;
   a pair of filters including a first filter and a second filter;
   a terminating impedance; and
   a first capacitor,
   wherein:
      a first terminal and a second terminal of the first filter are respectively coupled to a second terminal of the first quadrature hybrid coupler and a first terminal of the second quadrature hybrid coupler;
      a first terminal and a second terminal of the second filter are respectively coupled to a third terminal of the first quadrature hybrid coupler and a fourth terminal of the second quadrature hybrid coupler, respectively;
      the terminating impedance is coupled to a third terminal of the second quadrature hybrid coupler; and
      a first terminal and a second terminal of the first capacitor are respectively coupled to a first terminal and a fourth terminal of the first quadrature hybrid coupler, or respectively coupled to the second terminal and the third terminal of the first quadrature hybrid coupler, or respectively coupled to the first terminal and the fourth terminal of the second quadrature hybrid coupler, or respectively coupled to a second terminal and the third terminal of the second quadrature hybrid coupler, wherein the first capacitor is not included in the first quadrature hybrid coupler, is not included in the second quadrature hybrid coupler, and is not included in each filter of the pair of filters.

2. The radio frequency duplexer of claim 1, wherein the first capacitor, the first quadrature hybrid coupler, and the second quadrature hybrid coupler are configured to improve isolation or an insertion loss of the radio frequency duplexer.

3. The radio frequency duplexer of claim 1, wherein one or more of the pair of filters, the terminating impedance, and the first capacitor are tunable or reconfigurable.

4. The radio frequency duplexer of claim 1, comprising:
   at least one second capacitor coupled between the first terminal, the second terminal, the third terminal, or the fourth terminal of the first quadrature hybrid coupler and ground, or coupled between the first terminal, the second terminal, the third terminal, or the fourth terminal of the second quadrature hybrid coupler and ground, wherein the at least one second capacitor, the first quadrature hybrid coupler, and the second quadrature hybrid coupler are configured to further enhance isolation or an insertion loss of the radio frequency duplexer.

5. The radio frequency duplexer of claim 4, wherein the at least one second capacitor is tunable or reconfigurable.

6. The radio frequency duplexer of claim 1, wherein the first quadrature hybrid coupler, the second quadrature hybrid coupler, the pair of filters, the terminating impedance, and the first capacitor are integrated in a single package.

7. The radio frequency duplexer of claim 1, wherein the radio frequency duplexer is included in a multi-standard communication system or a multi-band communication system.

8. The radio frequency duplexer of claim 1, wherein the radio frequency duplexer is included in a device that supports wireless communications.

9. A tunable radio frequency duplexer, comprising:
   a first port;
   a second port;
   a third port;
   a first quadrature hybrid coupler;
   a second quadrature hybrid coupler;
   a first tunable radio frequency filter;
   a second tunable radio frequency filter;
   a third tunable radio frequency filter;
   a terminating impedance;
   a first tunable capacitor; and
   a second tunable capacitor,
   wherein:
      the third tunable radio frequency filter is similarly structured as the second radio frequency tunable filter,
      a first terminal and a second terminal of the first tunable radio frequency filter are respectively coupled to the first port and a first terminal of the first quadrature hybrid coupler,
      a first terminal and a second terminal of the second tunable radio frequency filter are respectively coupled to a second terminal of the first quadrature hybrid coupler and a first terminal of the second quadrature hybrid coupler,
      a first terminal and a second terminal of the third tunable radio frequency filter are respectively coupled to a third terminal of the first quadrature hybrid coupler and a fourth terminal of the second quadrature hybrid coupler, respectively,
      the terminating impedance is coupled to a third terminal of the second quadrature hybrid coupler,
      a second terminal of the second quadrature hybrid coupler is coupled to the second port,
      a fourth terminal of the first quadrature hybrid coupler is coupled to the third port,
      a first terminal of the first tunable capacitor is coupled to the first terminal of the first quadrature hybrid coupler, or the second terminal of the first quadrature hybrid coupler, or the first terminal of the second quadrature hybrid, or the second terminal of the second quadrature hybrid coupler,
      a second terminal of the first tunable capacitor is coupled to a ground,
      a first terminal of the second tunable capacitor is coupled to the third terminal of the first quadrature hybrid coupler, or the fourth terminal of the first quadrature hybrid coupler, or the third terminal of the second quadrature hybrid coupler, or the fourth terminal of the second quadrature hybrid coupler, a second terminal of the second tunable capacitor is coupled to a ground, and the first tunable capacitor is not included in the second tunable radio frequency filter, and the second tunable capacitor is not included in the third tunable radio frequency filter.

10. The tunable radio frequency duplexer of claim 9, wherein the first tunable capacitor and the second tunable capacitor are configured to improve isolation between the first port and the second port.

11. The tunable radio frequency duplexer of claim 9, comprising:

a third tunable capacitor, wherein:

a first terminal of the third tunable capacitor is coupled to the first terminal of the first quadrature hybrid coupler, or the second terminal of the first quadrature hybrid coupler, or the first terminal of the second quadrature hybrid coupler, or the second terminal of the second quadrature hybrid coupler, and a second terminal of the third tunable capacitor is coupled to the fourth terminal of the first quadrature hybrid coupler, or the third terminal of the first quadrature hybrid coupler, or the fourth terminal of the second quadrature hybrid coupler, or the third terminal of the second quadrature hybrid coupler, respectively.

12. The tunable radio frequency duplexer of claim 9, wherein the first radio frequency tunable filter, the second radio frequency tunable filter, the third radio frequency tunable filter, the first tunable capacitor, and the second tunable capacitor are controlled to improve performance of the tunable radio frequency duplexer.

13. The tunable radio frequency duplexer of claim 9, wherein the first radio frequency tunable filter, the second radio frequency tunable filter, the third radio frequency tunable filter, the first tunable capacitor, and the second tunable capacitor are controlled to improve isolation or an insertion loss of the tunable radio frequency duplexer for one or more frequency bands.

14. The tunable radio frequency duplexer of claim 9, wherein one or more of the first tunable radio frequency filter, the second tunable radio frequency filter, the third radio frequency tunable filter, the first tunable capacitor and the second tunable capacitor are controlled by analog control signals through a digital-to-analog (DAC) converter.

15. The tunable radio frequency duplexer of claim 9, wherein one or more of the first tunable radio frequency filter, the second tunable radio frequency filter, the third radio frequency tunable filter, the first tunable capacitor and the second tunable capacitor are controlled by digital control signals.

16. The tunable radio frequency duplexer of claim 9, wherein the tunable radio frequency duplexer is included in a multi-standard wireless communication system or a multi-band wireless communication system.

17. The tunable radio frequency duplexer of claim 9, wherein the tunable radio frequency duplexer is included in a cellular phone or a handheld wireless communication device.

18. A radio frequency duplexer, comprising:

a first port;

a second port;

a third port;

a first quadrature hybrid coupler and a second quadrature hybrid coupler;

a pair of filters including a first filter and a second filter;

a terminating impedance; and at least one transmission line, wherein:

a first terminal and a second terminal of the first filter are respectively coupled to a second terminal of the first quadrature hybrid coupler and a first terminal of the second quadrature hybrid coupler;

a first terminal and a second terminal of the second filter are respectively coupled to a third terminal of the first quadrature hybrid coupler and a fourth terminal of the second quadrature hybrid coupler, respectively;

the terminating impedance is coupled to a third terminal of the second quadrature hybrid coupler; and the at least one transmission line connects the second terminal of the first quadrature hybrid coupler and the first terminal of the first filter, or the third terminal of the first quadrature hybrid coupler and the first terminal of the second filter, or the first terminal of the second quadrature hybrid coupler and the second terminal of the first filter, or the fourth terminal of the second quadrature hybrid coupler and the second terminal of the second filter, wherein a characteristic impedance and a length of the at least one transmission line are configured to improve isolation or an insertion loss of the radio frequency duplexer.

19. The radio frequency duplexer of claim 18, wherein the characteristic impedance and the length of the at least one transmission line are configured to show characteristics of a capacitor or an inductor.

20. The radio frequency duplexer of claim 18, wherein the radio frequency duplexer is included in a multi-standard communication system or a multi-band communication system.

* * * * *